(12) United States Patent
Isoda

(10) Patent No.: US 7,301,775 B2
(45) Date of Patent: Nov. 27, 2007

(54) RECEIVING DEVICE

(75) Inventor: Hiroshi Isoda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/515,763

(22) Filed: Sep. 6, 2006

(65) Prior Publication Data

US 2007/0069932 A1 Mar. 29, 2007

(30) Foreign Application Priority Data

Sep. 26, 2005 (JP) ............................. 2005-277682

(51) Int. Cl.
*H05K 7/02* (2006.01)
*H03K 9/00* (2006.01)
(52) U.S. Cl. .................. 361/728; 361/760; 361/783; 375/316
(58) Field of Classification Search .............. 361/728, 361/760, 783; 375/316
See application file for complete search history.

(56) References Cited

U.S. PATENT DOCUMENTS

2006/0291178 A1* 12/2006 Shih ........................ 361/780

FOREIGN PATENT DOCUMENTS

| JP | 5-14015 A | 1/1993 |
|----|-----------|--------|
| JP | 09-097993 | 4/1997 |
| JP | 10-197662 A | 7/1998 |
| JP | 11-145570 | 5/1999 |
| JP | 2000-353895 A | 12/2000 |
| JP | 2004-128288 A | 4/2004 |

* cited by examiner

*Primary Examiner*—Evan Pert
(74) *Attorney, Agent, or Firm*—Birch, Stewart, Kolasch & Birch, LLP

(57) ABSTRACT

A tuner section is provided on one surface of a multilayered substrate, and a demodulating section on another surface of the multilayered substrate. The multilayered substrate further includes: an analog GND layer connected to the tuner section; a digital GND layer connected to the demodulating section; a shield GND layer which is provided between the analog GND layer and the digital GND layer; and insulation layers each provided (i) between the analog GND layer and shield GND layer, or (ii) between the digital GND layer and shield GND layer so as to electrically disconnect the shield GND layer from the analog GND layer and the digital GND layer. This allows the tuner section and the demodulating section to be respectively arranged on different surfaces of the substrate, for the purpose of downsizing of the receiving device, and yet allows the tuner section from being influenced by a harmonic signal generated in the demodulating section.

6 Claims, 11 Drawing Sheets

RECEIVING DEVICE

This Nonprovisional application claims priority under 35 U.S.C. § 119(a) on Patent Application No. 277682/2005 filed in Japan on Sep. 26, 2005, the entire contents of which are hereby incorporated by reference.

FIELD OF THE INVENTION

The present invention relates to a receiving device including a tuner section for receiving signal waves, and a demodulating section for outputting data signals by demodulating the signals having been received by the tuner section.

BACKGROUND OF THE INVENTION

Conventionally, information to be transmitted (such as image data, audio data, etc.) is converted into a digital signal, and the digital signal is then modulated into a high-frequency carrier wave (carrier frequency) to obtain a high-frequency digitally modulated signal which is transmitted to a receiving device via a space or a transmission path.

In this case, frequency bands of the modulated carrier wave are determined at a predetermined interval on the basis of each information piece to be transmitted, and a plurality of information pieces are respectively allotted to the plurality of frequency bands.

On the receiving device side, the frequency bands are continuously received, and only a particular high-frequency digitally modulated signal is extracted by a tuner section (analog section). The extracted particular high frequency digitally modulated signal is converted into a digital signal by an AD converter. The digital signal is then demodulated into a digital signal corresponding to the digital signals yet to be modulated, through a digital signal processing performed by a demodulating section (digital section).

An input level of the signal handled by the tuner section is not constant. This is because the tuner section extracts the particular high-frequency signal amongst digitally modulated high-frequency signals of the frequency bands. Accordingly, it is required that the tuner section be capable of appropriately receiving even if the input level is remarkably low. This necessitates reduction of influence of noise radiated from inside or outside the receiving device. Furthermore, downsizing of the receiving device is also required for the purpose of use in a mobile communications terminal such as a mobile phone.

Patent document 1 (Japanese Unexamined Patent Publication No. 14015/1993 (Tokukaihei 5-14015; published on Jan. 22, 1993)) discloses a high-frequency SMD module having a shielded high-frequency circuit, in which module: (i) a shield layer made of a GND pattern is set inside a multilayered substrate; (ii) a high-frequency circuit is mounted on a side, of the GND pattern, which is closer to the surface of the multilayered substrate; and (iii) the high-frequency circuit is provided thereon with a shield cap, and is connected to the GND pattern. Further, a resistor constituting the high-frequency circuit is set in the form of printed resistor, on the bottom-face side of the multilayered substrate, for the purpose of downsizing the receiving device.

Further, Patent document 2 (Japanese Unexamined Patent Publication No. 197662/1998 (Tokukaihei 10-197662; published on Jul. 31, 1998)) discloses a receiving device, aimed at downsizing by: (i) arranging, on one surface of a circuit wiring board, a receiving antenna section and a receiving circuit digital circuit section; (ii) arranging, on another surface of the circuit wiring board, a receiving circuit analog circuit section: and (iii) interposing an electromagnetic shield layer in the circuit wiring board.

Furthermore, in the field of printed circuit board, Patent document 3 (Japanese Unexamined Patent Publication No. 353895/2000 (Tokukai 2000-353895; published on Dec. 19, 2000)) discloses a printed circuit board including: a digital circuit-use GND layer arranged on the entire surface of an internal layer of a substrate; and an analog circuit-use GND layer which is arranged in an internal layer of an analog signal processing section, and which is adjacent to the digital circuit use GND layer.

Here, the technology of Patent document 1 enables downsizing of the apparatus in the width direction by an amount of setting the resistor constituting the high-frequency circuit, on the bottom surface side of the multilayered substrate. However, there is a limit to an amount that can be reduced by this method.

Further, in the downsizing method of Patent document 2, the receiving circuit analog circuit section and the receiving circuit digital circuit section are not sufficiently isolated from each other. Therefore, harmonic signals generated by ON/OFF of signals output from the receiving circuit digital circuit section influences the receiving circuit analog circuit section.

More specifically, the amplitude of the output signal of the receiving circuit digital circuit section is considerably large for a voltage of the signal input to the receiving circuit analog circuit section. On this account, the harmonic signals are generated with the ON/OFF of the output signal. Although the circuit wiring board of Patent document 2 has therein the electromagnetic shield layer, a voltage of harmonic signal component (harmonic signal voltage) is generated when a harmonic signal current flows in a parasitic inductance occurring in the electromagnetic shield layer. As such, the electric potential of the electromagnetic shield layer is not 0V, but a value to which the harmonic signal voltage is added. This variation in the electric potential of the electromagnetic shield layer influences the tuner section.

One approach to solve this problem is to combine the technologies of Patent documents 2 and 3: i.e. to make the electromagnetic shield layer of Patent document 2 a multilayered structure having an analog GND and a digital GND, as is disclosed in Patent document 3.

This however causes the following problem. Namely, the analog GND and the digital GND are bonded due to a parasitic capacitance between the both GNDs, and the electric potential of the analog GND varies thereby influencing the receiving circuit analog circuit section.

This point is described in further detail. The parasitic capacitance between the both GNDs varies depending on the materials of the substrate, and the thickness of the insulation layer. However, it is sufficiently possible that a capacitance of approximately 100 pF is generated in some cases. In a case where the frequency handled by the receiving device is several hundred MHz, the impedance for a capacitance of 100 pF is of the order of several Ω. This is almost the same as connecting the analog GND and the digital GND in the substrate at several Ω.

As such, the harmonic signal current of the harmonic signal flowing in a buffer, which outputs output signals of the receiving circuit digital circuit section, partially flows into the analog GND side via the digital GND and the parasitic capacitance.

Further, each of the analog GND and the digital GND is lead to a terminal electrode for providing connection with a GND outside the receiving device. A parasitic capacitance is also generated there.

A voltage of harmonic signal component (harmonic signal voltage) is generated when a harmonic signal current flows in a parasitic inductance of the analog GND. As such, the electric potential of the analog GND is not 0V, but is a value to which the harmonic signal voltage is added. This variation in the electric potential of the GND influences the receiving circuit analog circuit section.

As described, an arrangement of a tuner section (analog section) and a demodulating section (digital section) in a close distance to each other, for the purpose of downsizing the receiving device, causes a problem that the tuner section which handles minute signal input is largely influenced by the harmonic signal generated by the demodulating section which handles signals of a large amplitude. Accordingly, in order to receive minute signals, the parasitic capacitance between the analog GND and the digital GND needs to be increased as much as possible.

SUMMARY OF THE INVENTION

The present invention is made in view of the foregoing problem, and it is objects of the present invention to: down-size a receiving device by respectively providing a tuner section and demodulating section on a different surfaces of a substrate; and to prevent the tuner section from being influenced by the current of harmonic signals generated in the demodulating section.

In order to solve the foregoing problems, a receiving device of the present invention includes: a multilayered substrate; a tuner section provided on one surface of said multilayered substrate; and a demodulation section provided on another surface of said multilayered substrate, wherein said tuner section extracts a particular high-frequency signal from a plurality of digitally modulated high-frequency signals, and converts the particular high-frequency signal into a low-frequency signal, said demodulation section demodulates the low-frequency signal output from said tuner section by converting it into a digital signal, and said multilayered substrate includes (i) an analog GND layer connected to said tuner section, (ii) a digital GND layer connected to said demodulation section, and (iii) a shield GND layer which is provided between said analog GND layer and digital GND layer, and which is isolated from the both GND layers by insulation layers.

In the above configuration, the shield GND layer is provided between the digital GND layer and the analog GND layer. Thus, the current of harmonic signals is prevented from flowing into the analog GND. Accordingly, it is possible to downsize the receiving device by arranging the tuner section on one surface of the multilayered substrate and the demodulating section on another surface of the substrate, and yet prevent deterioration in the receiving capability by preventing the tuner section from being influenced by the harmonic signals from the demodulating section.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention. A receiving device of the present embodiment continuously receives carrier waves (digitally modulated high-frequency signals; broadcast waves) whose frequency bands are determined at a predetermined interval on the basis of each information piece to be transmitted so that a plurality of information pieces are respectively allotted to the plurality of frequency bands. Further, the receiving device is downsized by integrating (i) a tuner section for receiving broadcast signals and (ii) a demodulating section for demodulating digital signal converted from signals (specific high-frequency signals) received via a receiving channel selected by the tuner section, and for outputting the resulting data signals. Note that the receiving device is, for example, provided to a small television receiver or the like.

Figure 2:
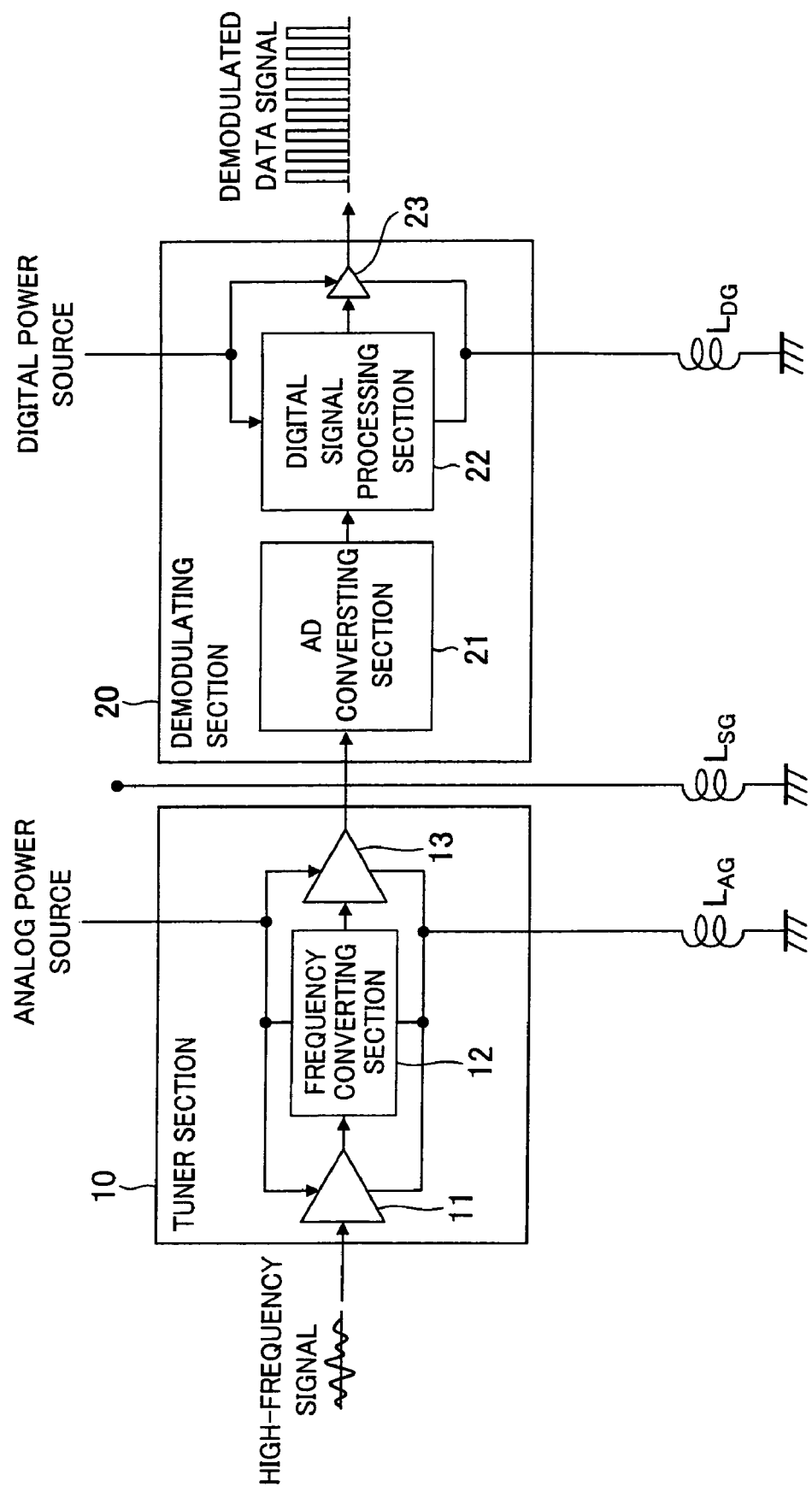
FIG. 2 is a block diagram illustrating a schematic configuration of the receiving device of the embodiment, in accordance with the present invention.

FIG. 2 is a block diagram illustrating schematic configuration of a receiving device 100 of the present embodiment. As illustrated, the receiving device 100 includes: a tuner section (analog circuit section) 10; and a demodulating section (digital circuit section) 20.

The tuner section 10 takes out only a particular harmonic signal from a plurality of digitally modulated high-frequency signals (high-frequency digitally modulated signals) in a frequency band. This tuner section 10 includes an RF (Radio frequency; high-frequency) amplifier 11, a frequency converting section 12, and an IF (intermediate frequency) amplifier 13.

The RF amplifier 11 amplifies received high-frequency signals and outputs the amplified signals to the frequency converting section 12. The frequency converting section 12 converts the frequency of the high-frequency signals having received from the RF amplifier 11, and outputs the resulting signals to the IF amplifier 13. The IF amplifier 13 amplifies the signal having been subjected to the frequency conversion, and outputs the resulting signals to the demodulating section.

The high-frequency digitally modulated signals having been received by the tuner section 10 are then demodulated by the demodulating section 20 which includes: an AD converting section 21; a digital signal processing section 22; and an output amplifier 23, so that digital signals corresponding to those before the modulation in the transmission side device are obtained.

More specifically, the AD converting section 21 converts the analog signals received from the tuner section 10 into digital signals, and outputs the digital signals to the digital signal processing section 22. Then, the digital signal processing section 22 demodulates the digital signals received from the AD converting section 21, so that the digital signals (hereinafter, demodulated data signals) corresponding to those before the modulation are obtained. The demodulated data signals are output by the digital signal processing section 22, via the output amplifier 23.

Figure 3:
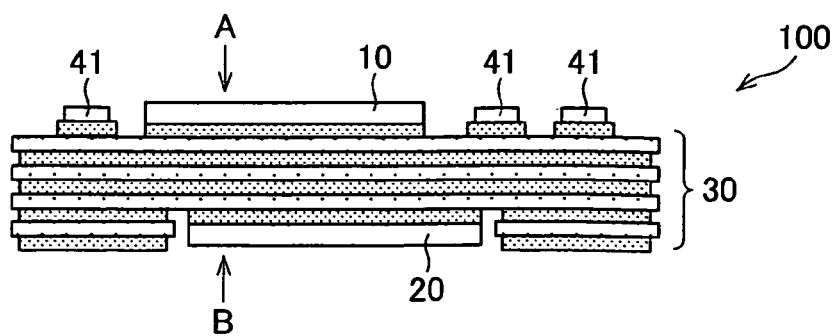
FIG. 3(a) is a cross sectional view of the receiving device of the embodiment, in accordance with the present invention.
FIG. 3(b) is a plane view of the receiving device viewed from the direction-A shown in FIG. 3(a).
FIG. 3(c) is a plane view of the receiving device viewed from the direction-B shown in FIG. 3(a).
Figure 3:
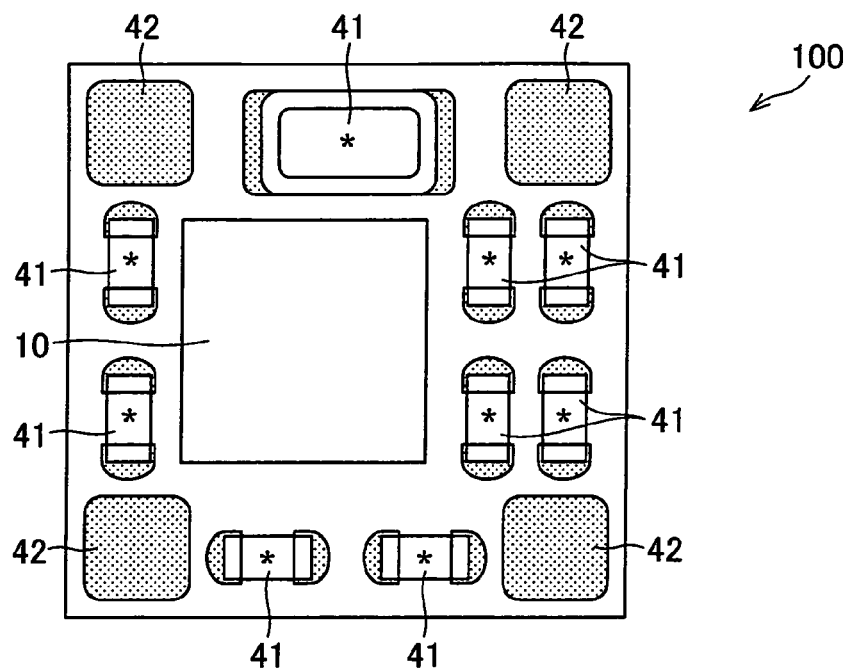
Figure 3:
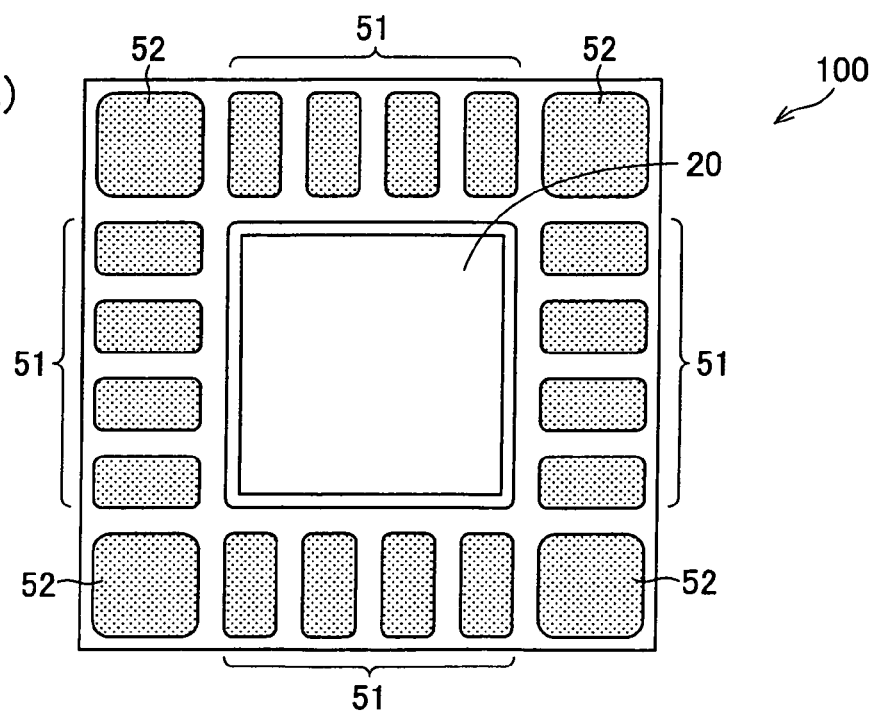

FIG. 3(a) is a cross sectional view of the receiving device 100, and FIG. 3(b) is a plane view of the receiving device 100 viewed from the direction-A indicated in FIG. 3(a). Further, FIG. 3(c) is a plane view of the receiving device 100 viewed from the direction-B indicated in FIG. 3(a).

As illustrated in FIG. 3(a), in the receiving device 100, the tuner section 10 is provided on one surface (first surface) of a substrate 30 (hereinafter, first substrate), and the demodulating section 20 is provided on another surface (second surface) of the first substrate 30 so as to face the tuner section across the first substrate 30. The first substrate 30 is described in detail later.

In addition to the tuner section 10, the first surface of the first substrate 30 is provided thereon with: (i) peripheral members 41 such as a capacitor, a resistor, a crystal oscillator or the like; and (ii) an adhesion section 42 or the like for use in adhering a shielding lid to the first substrate 30 (See FIG. 3(b)).

Further, in addition to the demodulating section 20, the second surface is provided thereon with: (i) terminal electrodes 51 for electrically connecting members (tuner section 10, demodulating section 20, peripheral members 41) provided to the receiving device 100 with members provided to a receiving device mounting substrate (hereinafter, second substrate) for mounting thereon the receiving device 100; and (ii) GND electrodes 52 for electrically connecting GNDs (described later) provided to the second substrate and the first substrate 30 (See FIG. 3(c)). Note that each of the GND electrodes, which is provided in a corner portion of the first substrate 30 having a rectangular shape, is also for ensuring adhesion strength between the second substrate and the receiving device 100.

Figure 4:
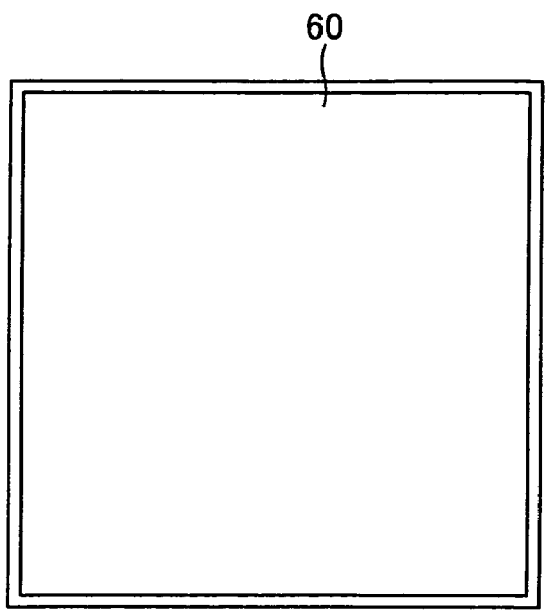
FIG. 4(a) is a plane view illustrating the receiving device of the embodiment, in accordance with the present invention, which apparatus is mounted on a receiving device mounting substrate.
FIG. 4(b) is a cross sectional view of the receiving device of FIG. 4(a), which is mounted on the receiving device mounting substrate.
Figure 4:
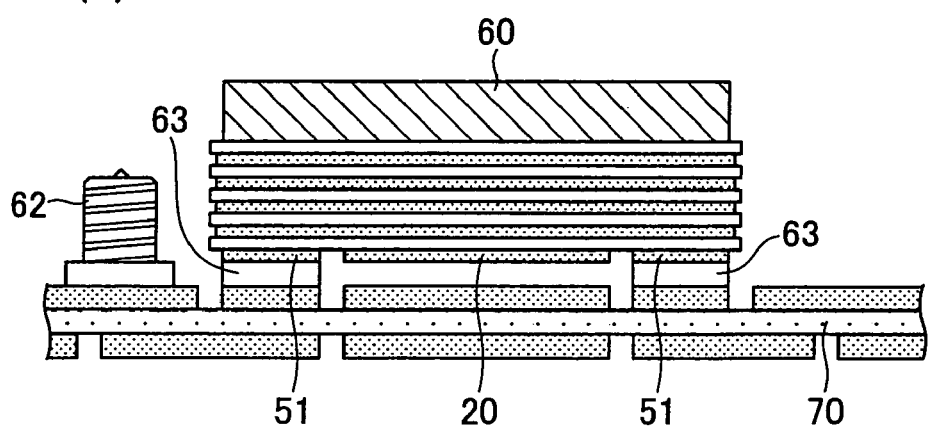

FIG. 4(b) is a cross sectional view illustrating the receiving device 100 being mounted on the second substrate 70. As illustrated, the terminal electrodes 51 and GND electrodes 52 of the receiving device 100 are jointed to a wiring layer formed on the surface of the second substrate 70, with a use of solder 63.

Further, as illustrated in FIG. 4(b), this second substrate 70 is provided with an antenna terminal (high-frequency signal input section) 62 to which signals having received via an antenna section (not shown) are input. The signals having input to the antenna terminal are input to the tuner section 10 of the receiving device 100.

FIG. 4(a) is a plane view of the receiving device 100 mounted on the second substrate 70, which apparatus viewed from above. As illustrated in FIG. 4(a) and FIG. 4(b), the side of the receiving device 100, on which side the tuner section 10 is provided, is covered by the shielding lid 60, so that the noise is prevented from entering the tuner section 10 from outside the receiving device 100.

Figure 1:
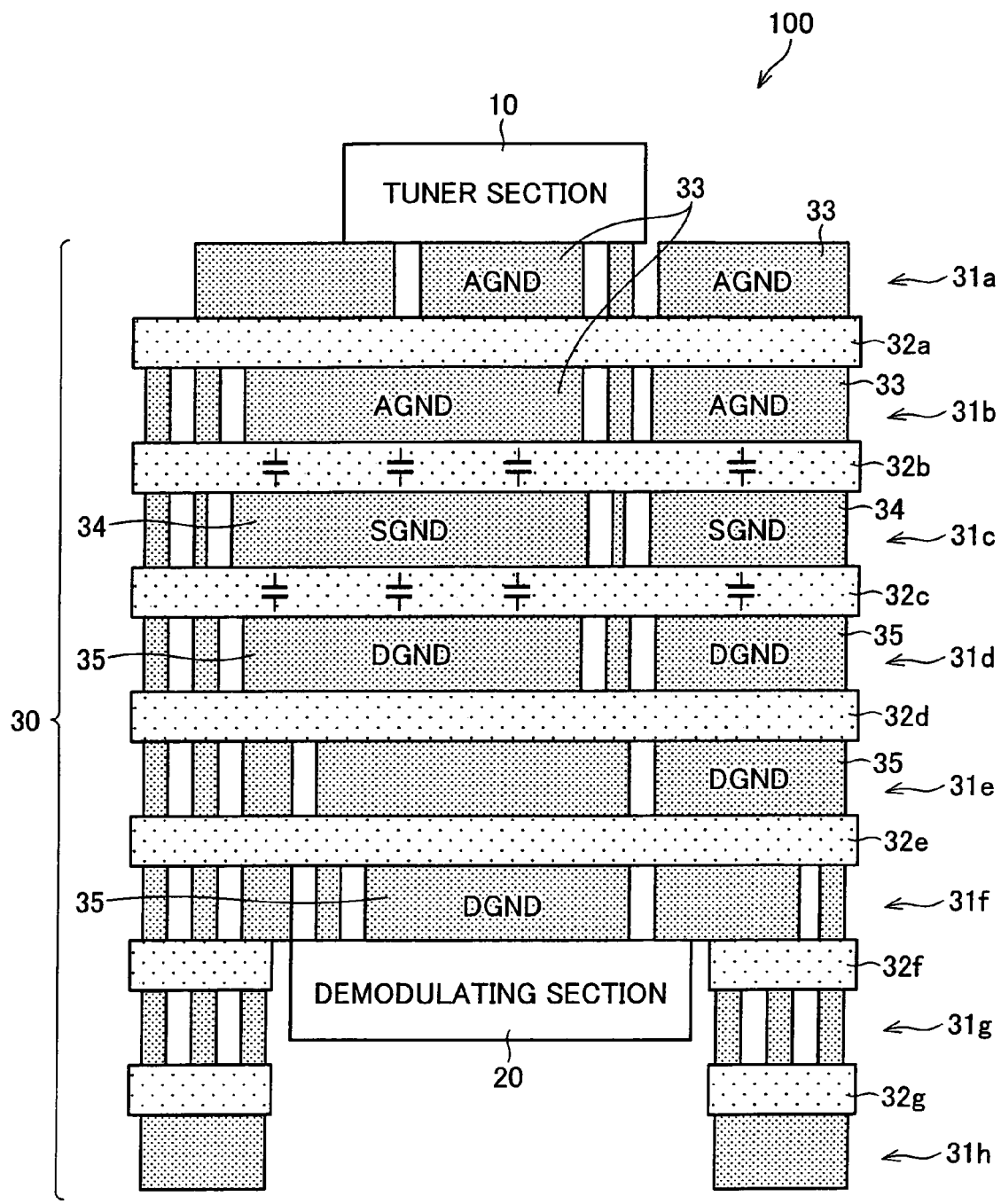
FIG. 1 is a cross sectional view illustrating a receiving device of an embodiment in accordance with the present invention.

Next, described is a configuration of the first substrate (mounting section) 30 of the receiving device 100. FIG. 1 is a cross sectional view illustrating a configuration of the receiving device 100. As illustrated in the figure, the first substrate 30 is a multilayered substrate in which a plurality of wiring layers and insulation layers are alternately laminated. Further, the tuner section 10 and the demodulating section 20 are respectively mounted on the front surface (first surface) and the back surface (second surface) of the first substrate 30.

First and second wiring layers 31a and 31b on the side of the tuner section 10 are provided with analog GNDs (AGNDs; analog GND layers) 33 which are electrically connected to the tuner section 10. A third wiring layer 31c is provided with a shield GND (SGND; shield GND layer) 34. Forth, fifth, and sixth wiring layers 31d to 31f are provided with digital GNDs (DGND; digital GND layers) 35 which are electrically connected to the demodulating section 20. Seventh and eighth wiring layers 31g and 31h serves as frame for realizing a space for arranging the demodulating section 20. Further, each of the wiring layers are provided with vias for realizing electrical connections (i) between the antenna terminals 62 provided on the second substrate 70 and the tuner section 10; (ii) between the tuner section 10 and the demodulating section 20; and (iii) between the demodulating section 20 and the demodulated data signal input terminal (not shown) provided to the second substrate 70.

Note that the present embodiment deals with a case where eight wiring layers are provided. However, the number of the wiring layers is not limited to this.

Further, in the present embodiment, the thickness of the first substrate 30 is 1 mm or less. Note, however, that the thickness of the substrate 30 is not limited to this, and for example, the thickness of the first substrate 30 may be 1 mm or more, provided that there is no regulation for the size in the height direction of the receiving device 100: i.e. in the thickness direction of the first substrate 30. Alternatively, the thickness of the first substrate 30 may be further reduced. However, the first substrate 30 is also for maintaining the strength of the module configuration of the receiving device 100. As such, the first substrate 30 needs to be such that suitable strength thereof is maintained by the thickness and material thereof.

As illustrated in FIG. 1, the shield GND 34 is provided between the analog GND 33 and the digital GND 35, and an insulation layer is interposed between the shield GND 34 and the analog GND 33, and between the shield GND 34 and the digital GND 35, so that the analog GND 33 and the digital GND 35 are electrically separated (shielded) from each other.

Figure 5:
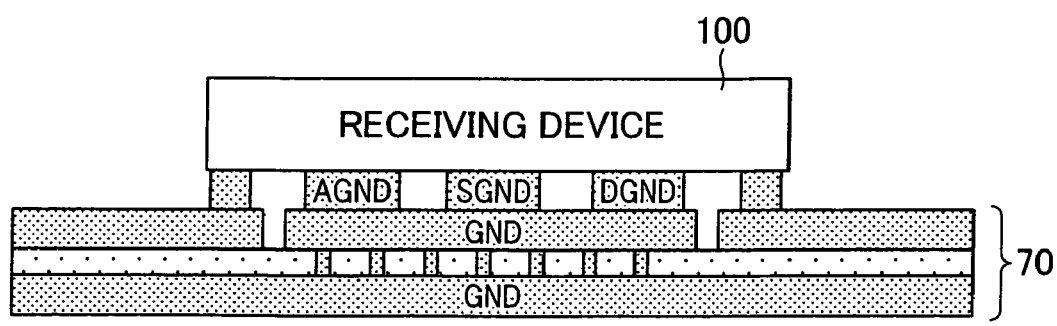
FIG. 5 is a cross sectional view illustrating an example of connection status amongst GNDs, while the receiving device of the embodiment in accordance with the present invention is mounted on the receiving device mounting substrate.

Further, the analog GND 33, shield GND 34, and digital GND 35 are not connected to one another (i.e. these members are insulated from one another) in the receiving device 100, and are individually connected to GND wiring of the second substrate 70, via GND connection terminals respectively (See FIG. 5). Note that the shield GND 34 is connected only to a GND connection terminal (Shield GND connection terminal) which connects the shield GND connection terminal to the GND layer (substrate GND) of the second substrate 70, and not to other signal lines in the receiving device 100.

As described, in the receiving device 100 of the present embodiment, the tuner section 10 is arranged on one side of the first substrate 30, and the demodulating section 20 is arranged on another side of the first substrate 30. The first substrate 30 is a multilayered substrate in which a plurality of wiring layers and insulation layers are laminated. This substrate 30 includes a shield GND which is: (A) provided between (i) the analog GND 33 connected to the tuner section 10 and (ii) the digital GND 35 connected to the demodulating section 20, so as to electrically separate (shield) the analog GND 33 and the digital GND 35 from each other, and (B) not connected to analog GND 33 or digital GND 35, (C) connected only to the GND connection terminal for connecting the shield GND to the GND of the second substrate 70.

With this configuration, the harmonic signal from the digital GND 35 flows to the GND of the second substrate 70, via the shield GND 34. This prevents or reduces the current of the harmonic signal flowing from the digital GND 35 into the analog GND 35. Since the tuner section 10 which handles minute signals is prevented from being influenced by a harmonic signal component from the demodulating section 20 which handles a large amplitude, deterioration in receiving capability is prevented even in the case of downsizing the receiving device 100 by arranging the tuner section 10 on one surface and the demodulating section 20 on the other surface of the substrate.

It is preferable to set the area of each surface of the shield GND 34 facing other GND (analog GND, digital GND) based on (i) the dielectric constant and thickness of an insulation layer between the shield GND 34 and another GND and (ii) a frequency of received signal (signal taken out by the tuner section 10) so that the impedance of a parasitic capacitance between the shield GND 34 and the other GND facing the shield GND 34, which impedance is for a frequency of the concerned noise component, is larger than that of wiring, in the receiving device 100, for connecting the shield GND 34 in the receiving device 100 with the GND of the second substrate 70 (receiving device mount device) on which the receiving device 100 is mounted.

Larger impedance between the shield GND 34 and the other GND facing the shield GND 34 is better in terms of preventing influence from the noise component. However, the size of the impedance can be determined based on a difference between a signal level of the received signal (signal strength) and a signal level of the noise component.

For example, if the signal level of the received signal is sufficiently higher than the signal level of the noise component, the impedance between the shield GND 34 and the GND facing the shield GND 34 is made larger than the impedance of the GND for connecting the shield GND 34 with the second substrate 70.

Note that the signal level of the noise component is hardly dependent on the signal level of the received signal, and is determined by the configuration of the receiving device. Accordingly, if the signal level of the received signal is small (when receiving a minute signal), it is preferable to further increase the impedance of the parasitic capacitance between the shield GND 34 and another GND facing the shield GND 34.

For example, in a case of receiving a signal whose signal level is as weak as the signal level of a noise component, it is preferable that the sum of (i) the impedance of the parasitic capacitance between the shield GND 34 and the digital GND 35 and (ii) the impedance of a parasitic capacitance between the shield GND 34 and the analog GND 32 be not less than 30 times (not less than 30 db in isolation) of the impedance of the wiring connecting the shield GND 34 with the GND of the second substrate 70. In consideration of the margin of errors amongst circuits, the sum is preferably not less than 100 times (not less than 40 db in isolation) of the impedance of the wiring. Here, "isolation" is a value indicated by $20 \log_{10}(Va/Vd)$ where: a voltage of a noise component in the digital GND 35 is Vd; and the voltage having transmitted to the analog GND 32 via the parasitic capacitance between the GNDs 35 and 32 is Va.

Figure 6:
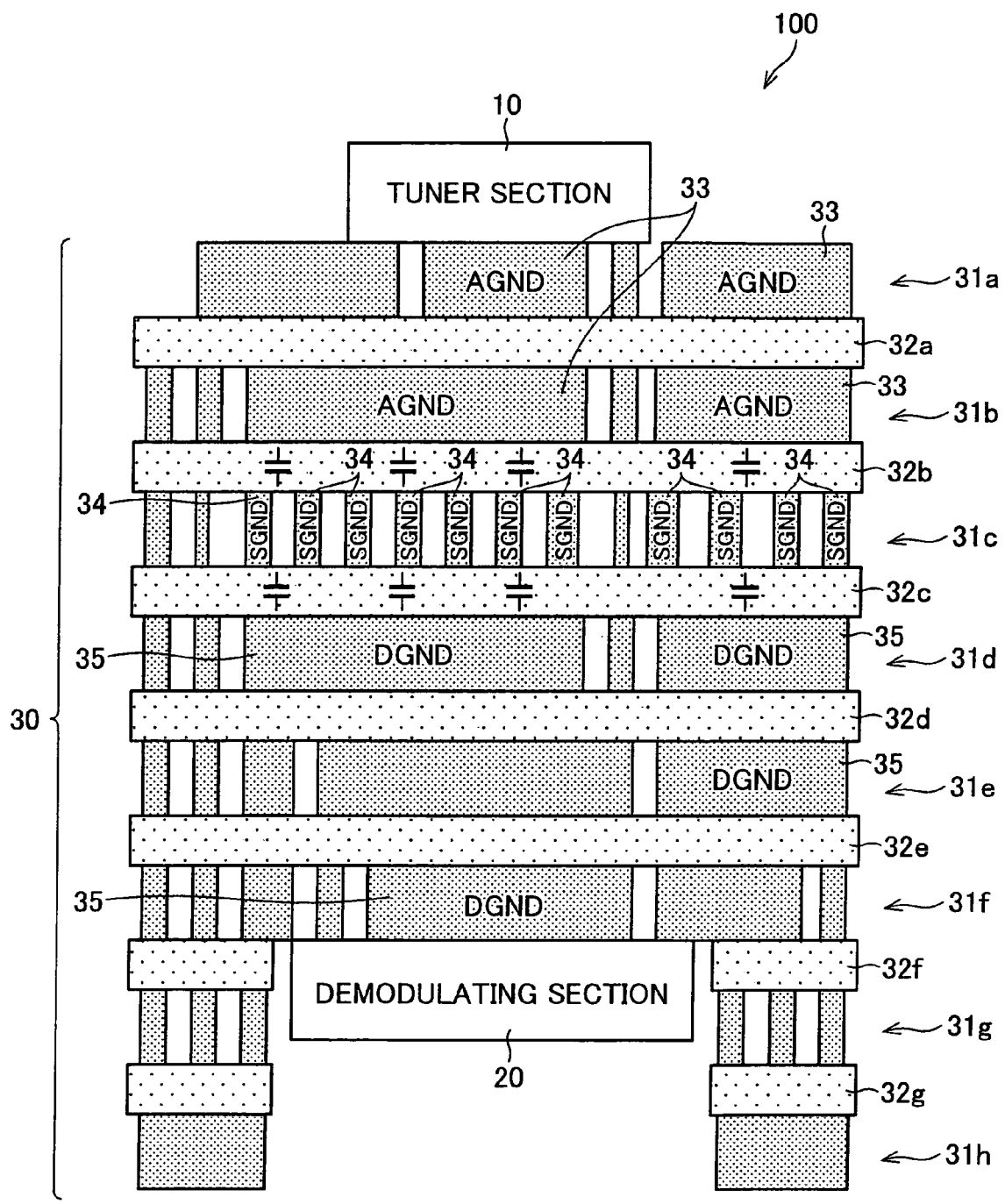
FIG. 6 is a cross sectional view illustrating an alternative form of the receiving device of the embodiment, in accordance with the present invention.

In order to increase the impedance of the parasitic capacitance formed between the shield GND 34 and another GND (i.e. to reduce the value of the parasitic capacitance), the pattern of the shield GND 34 may be partially taken out as illustrated in FIG. 6 so that the planer dimension of the surface of the shield GND 34, which surface faces the other GND, is reduced. This more effectively prevents an influence of the harmonic signal current from the digital GND 35 to the analog GND 33.

Figure 7:
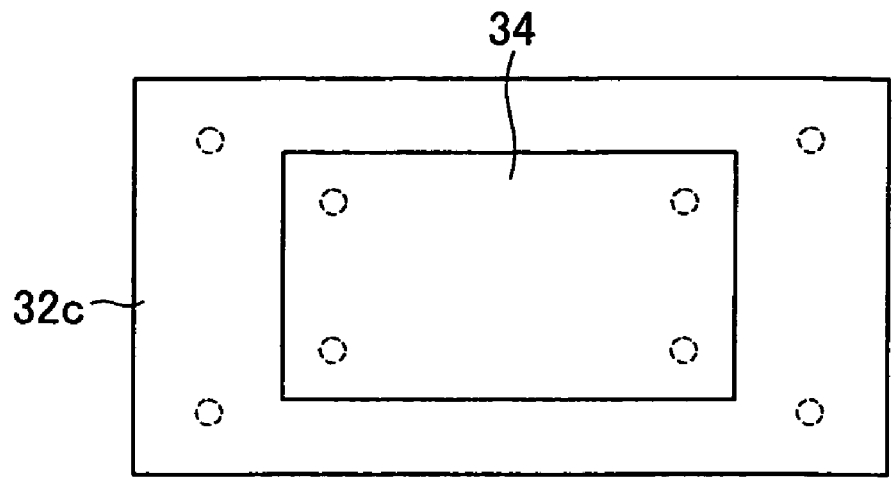
FIG. 7(a) is a plane view illustrating an exemplary shape of a shield GND which is provided to the receiving device of the embodiment, in accordance with the present invention.
FIG. 7(b) is a plane view illustrating another exemplary shape of the shield GND which is provided to the receiving device of the embodiment, in accordance with the present invention.
Figure 7:
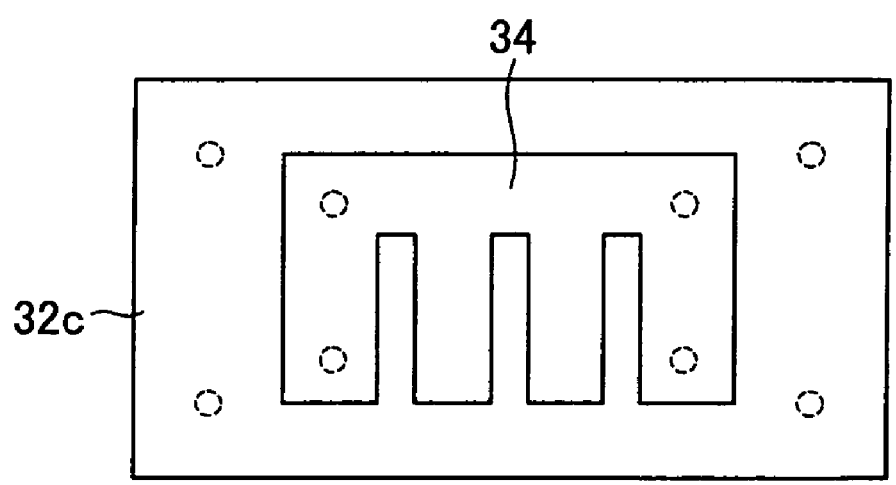

FIG. 7(a) is a plane view illustrating the third wiring layer 31c having the shield GND 34 from which a portion of the pattern is not removed. Further, FIG. 7(b) is a plane view illustrating an example of the third wiring layer 31c having the shield GND 34 from which a portion of the pattern is removed. In the example of FIG. 7(b), a portion of the shield GND 34 is taken out so that the shield GND 34 is in a calm-like shape. Note, however, that the shape of the shield GND 34 is not limited to this.

In the present embodiment, the insulation layer is made of ceramic. More specifically, the insulation layer is made as follows. Namely, a layer on which a pattern of wiring layer is printed is superimposed on a clayey sheet obtained by kneading minute ceramic particles with a solvent. Then, the sheet and the layer are pasted to each other with an application of even pressure, and then subjected to a sintering process. In this case, the insulation layer is made of a relatively soft material obtained by kneading minute ceramic particles with a solvent, while the vias and the GND pattern or the like are made of a solid material containing metal. As such, the GND pattern gradually sinks in the insulation layer. That is, the removed portion of the GND pattern is filled with the insulation layer. In other words, the removed portion of the shield GND 34 is filled with an interlayer material (the material of the insulation layer).

Figure 8:
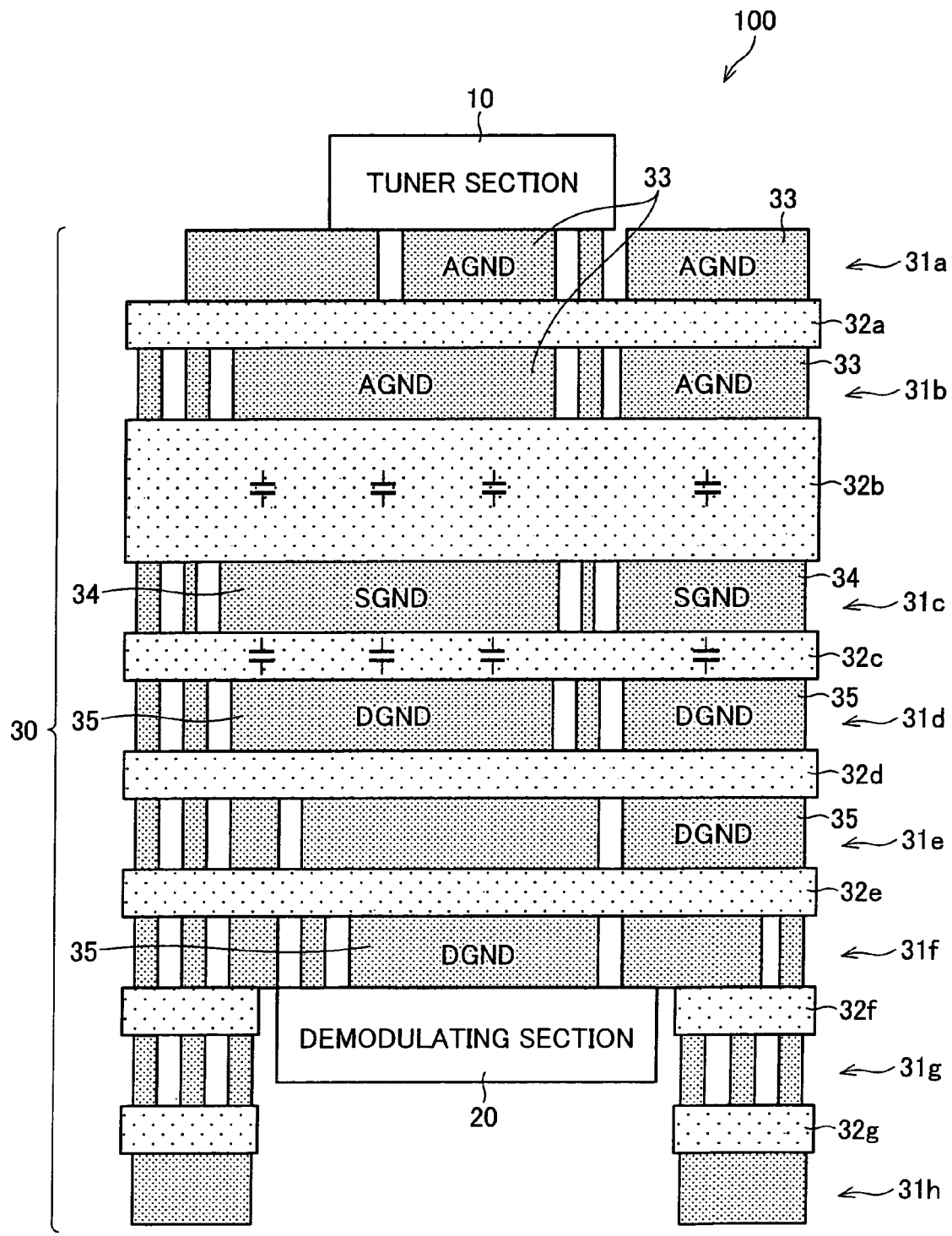
FIG. 8 is a cross sectional view illustrating another alternative form of the receiving device of the embodiment, in accordance with the present invention.

Further, as illustrated in FIG. 8, the thickness of the insulation layer 32b between the analog GND 33 and the shield GND 34 may be made thicker than other insulation layers. This reduces the value of the parasitic capacitance between the analog GND 33 and the shield GND 34 in inverse proportion to the square of the distance between these GNDs. Therefore, the impedance for a high frequency increases, and harmonic signal current flowing into the analog GND 33 is reduced.

In the example of FIG. 8, the insulation layer 32b between the analog GND 33 and the shield GND 34 is thickened. The present invention however is not limited to this, and it is possible to thicken the insulation layer 32c between the shield GND 34 and the digital GND 35. Alternatively, it is possible to thicken both of the insulation layers 32b and 32c. However, thickening of an insulation layer closer to the second substrate 70 causes a longer distance between the shield GND 34 and the GND connection terminal. This causes a large inductance of a connection route connecting the shield GND 34 with the second substrate 70. For this reason, the thickness of the insulation layer closer to the second substrate 70 is preferably such that the impedance of the parasitic capacitance between the shield GND 34 and another GND facing across the insulation layer is larger than the impedance of the connection route connecting the shield GND 34 with the GND of the second substrate 70.

Figure 9:
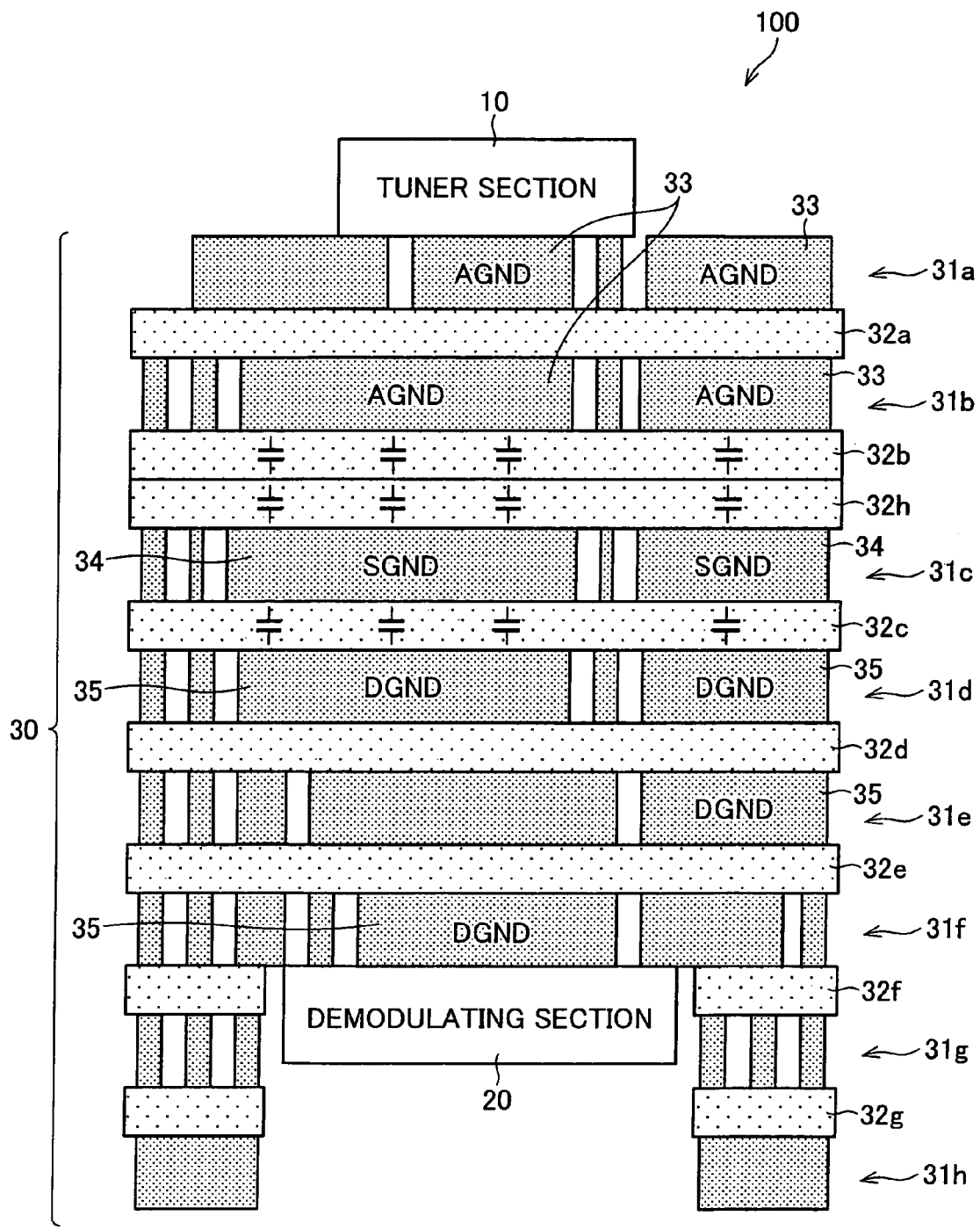
FIG. 9 is a cross sectional view illustrating yet another alternative form of the receiving device of the embodiment, in accordance with the present invention.

Further, as illustrated in FIG. 9, it is possible to further provide, between the analog GND 33 and shield GND 34, an insulation layer 32h which has no wiring pattern, and which has only a via for connecting signal lines or the like of upper and lower layers. In other words, it is possible to provide a plurality of insulation layers between the analog GND 33 and the shield GND 34. This results in similar effects obtained in the case of thickening the thickness of the insulation layer 32b between the analog GND 33 and the shield GND 34. In this case, the parasitic capacitance is reduced as in the case of thickening an insulation layer, by using insulation layers having the same thickness, instead of thickening a particular insulation layer. This is advantageous in that the manufacturing process is simplified.

Further, a low-dielectric material may be used as an insulation layer to increase the impedance of the capacitance (i.e. reduced the parasitic capacitance) between the shield GND 34 and another GND. That is, the material of the insulation layers 32a to 32g are not limited to ceramic which is adopted in the present embodiment, and for example, the material may be various materials (e.g. organic material or the like) which have conventionally been used as a material for an insulation layer. However, the use of ceramic is advantageous in that a via (space forming rim) is easily formed. Incidentally, conventional multilayered substrates often adopt a glass epoxy board which is formed by soaking thin glass fiber with epoxy resin, and hardening the epoxy resin. However, it is difficult to form a depression in a portion of a glass epoxy made substrate. This is because, perforating a hole through a part of the glass fiber is not easy, and, even if a hole is perforated, the shape of the hole cannot be accurately retained until the epoxy resin is hardened, due to high flowability of unhardened epoxy resin. On the contrary, in the case of using ceramic, a pattern is printed and is pasted on a clayey sheet (the sheet yet to be sintered is soft, but the sheet is not deformed as long as it is in a frame by which a plane surface is retained, as is the case of clay), and then is sintered at a high temperature. Therefore, a hole is easily realized by perforating the hole beforehand, and then performing the pasting and sintering process.

Note that the dielectric constant of ceramic is approximately 10, and it is slightly higher than a conventional organic material whose dielectric constant is approximately 4. Further, the insulation layers of the present embodiment are relatively made thin (100 μm or less) so as to reduce the size of the receiving device 100 in the height direction (normal direction of the surface of the first substrate 30). Accordingly, an influence from a noise component (high-frequency spurious signal or the like) particularly tends to increase with an increase in the frequency of the noise component. In view of that, in the present embodiment, the planer dimension of the shield GND 34 is set as follows. Namely, the value of the parasitic capacitance is calculated from: (i) a planer dimension of a portion facing another GND; (ii) the thickness of an insulation layer between the shield GND 34 and the other GND; and (iii) the dielectric constant of the insulation layer. Then, the planer dimension of the shield GND 34 is set so that the impedance of the parasitic capacitance, which impedance is for the frequency of a noise component corresponding to the frequency of a received signal, is of the order of several hundred Ω. Note that the impedance of the shield GND 34 in the receiving device 100 (i.e. the impedance between the shield GND 34 and the connection terminal for connecting the shield GND 34 with the second substrate) is several Ω. A preferable impedance value of the capacitance between the shield GND 34 and the other GND facing the shield GND 34 varies depending on the capability of the demodulating section 20 provided in a latter stage of the tuner section 10. However, the impedance value is preferably such that a received signal and a frequency component corresponding to the received signal, which component is in the noise component flowing into the shield GND 34, are different from each other by 30 db or more.

Further, since the receiving device 100 is an ultra small receiving device, the impedance of each GND in the receiving device 100 is not low. On the contrary, the impedance of the GND in the receiving device mounting device (second substrate 70) is low as compared with the receiving device 100. Accordingly, in the present embodiment, the analog GND 33, shield GND 34, and the digital GND 35, which are apart from each other in the receiving device 100, are connected to a common GND provided to the second substrate 70, as illustrated in FIG. 5.

Figure 10:
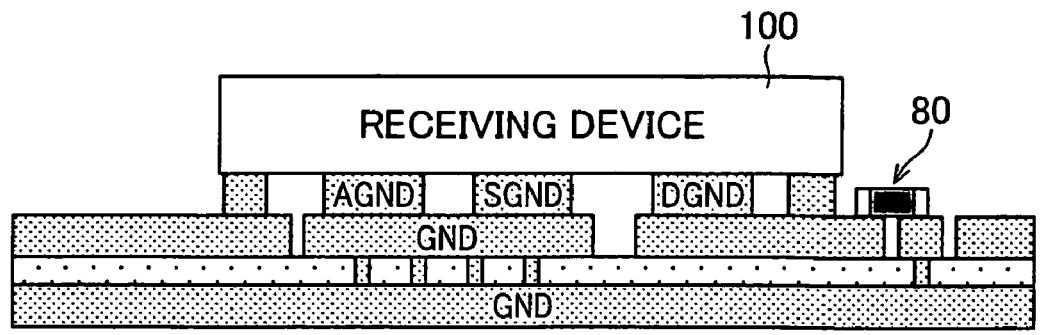
FIG. 10 is a cross sectional view illustrating another exemplary connection status amongst the GNDs, while the receiving device of the embodiment, in accordance with the present invention, is mounted on the receiving device mounting substrate.

However, since the impedance of the GND in the second substrate 70 is low, a noise component in the receiving device 100 may flow in the receiving device 100 again after flowing into the GND of the second substrate 70. In view of that, as illustrated in FIG. 10, an element (flow-out preventing means) 80 for blocking high-frequency component may be provided between the digital GND 35 of the receiving device 100 and the GND of the second substrate 70, so as to prevent the noise component from flowing out. For example, the element may be an inductor or the like whose impedance for the frequency in the frequency band of the receiving device 100 is high. It is preferable to implement a measure to sufficiently reduce the noise component occurring in the receiving device 100, in the case of providing such an element.

Further, in the present embodiment, members constituting the tuner section 10 or the demodulating section 20 may be individually provided. Alternatively, it is possible to realize the tuner section 10 and the demodulating section 20 in the form of semiconductor integrated circuit for the purpose of further downsizing the receiving device 100.

In the case of realizing the tuner section 10 and the demodulating section 20 in the form of semiconductor integrated circuit, the tuner section 10 and the demodulating section 20 are mounted to the receiving device 100 by using a typical mounting method in which, for example, a package entirely sealed with resin is mounted by (i) fixing on a metal-made lead frame, a die having been cut out from a wafer having thereon tuner sections or demodulating sections; and (ii) bonding a terminal of a lead frame with an external electrode on the surface of the die, by using conductive line made of gold or the like.

Figure 11:
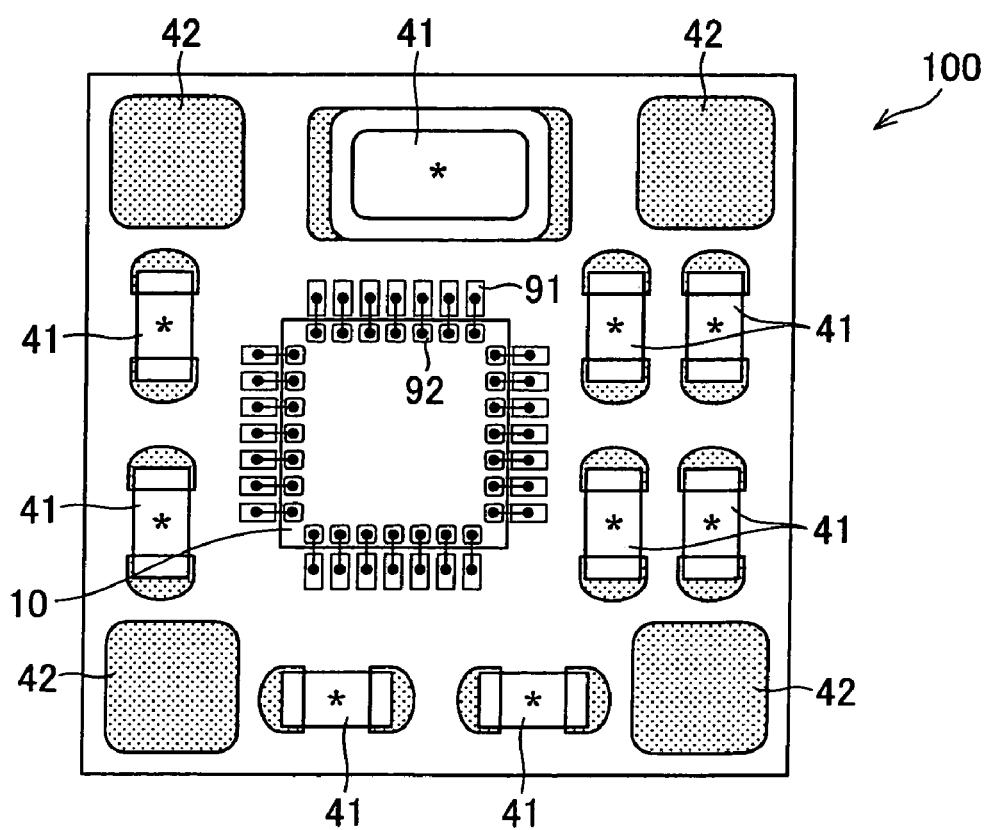
FIG. 11 is a plane view illustrating an exemplary mounting method for use in a case of realizing, in the form of semiconductor integrated circuit, a tuner section and a demodulating section to be provided to the receiving device of the embodiment, in accordance with the present invention.

Further, for the purpose of downsizing, it is possible to directly fixing the cut-out die onto a mount portion of the first substrate 30, and to bond, by using a conductive line made of gold or the like, an electrode 91 provided on the mount portion of the first substrate 30 with the external electrode 92 of the die, as illustrated in FIG. 11.

Figure 12:
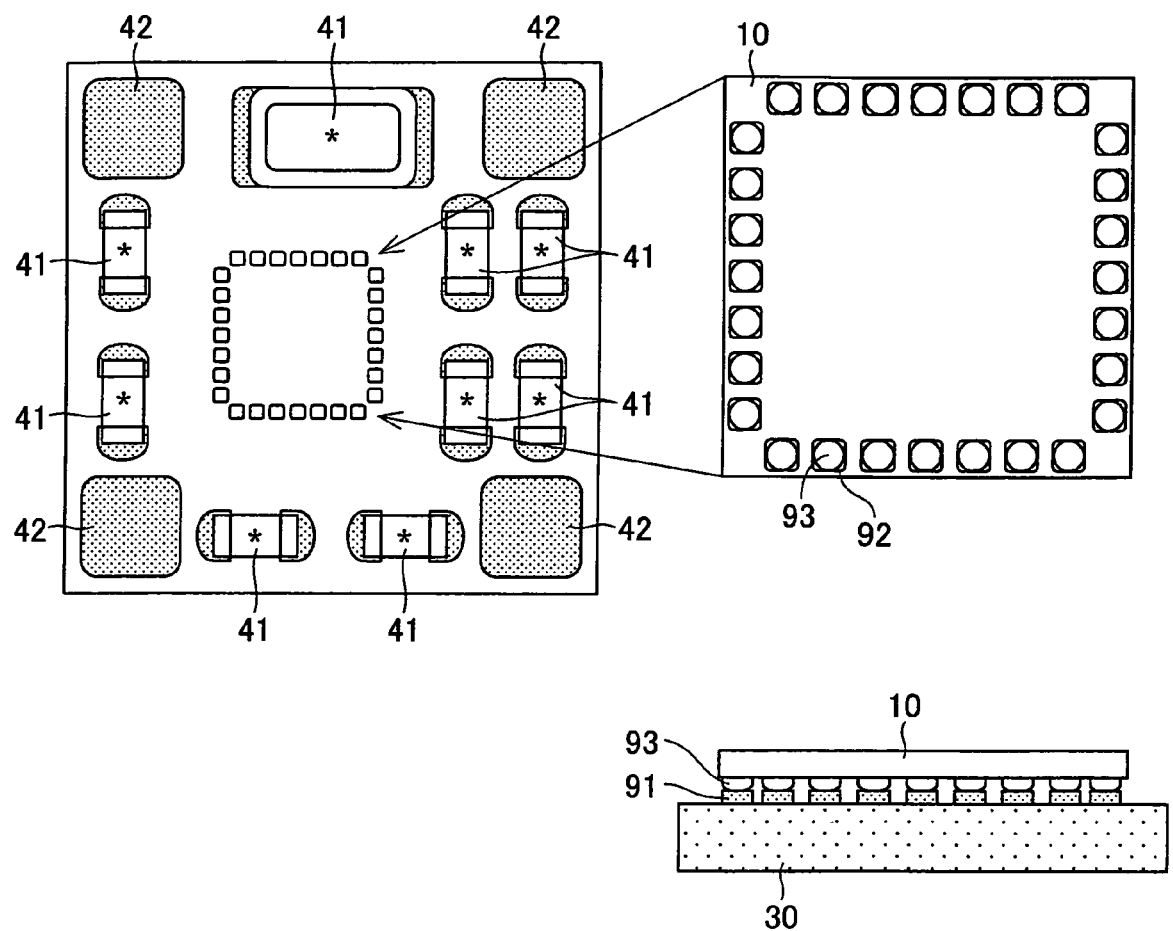
FIG. 12 is a plane view illustrating another exemplary mounting method for use in the case of realizing, in the form of semiconductor integrated circuit, the tuner section and the demodulating section to be provided to the receiving device of the embodiment, in accordance with the present invention.

Further, as illustrated in FIG. 12, it is possible to fix the die on the first substrate 30, by (i) forming in advance a conductive jointing member 93 on the external connection terminal 92 on the surface of the die; (ii) positioning the die so that the position of the jointing member 93 and the position of an electrode 91 formed on the mount position of the first substrate 30 accurately match with each other, the electrode 91 being formed so that its position corresponds to the position of the external connection terminal 92 on the surface of the die; (iii) pushing the die against the first substrate 30; and (iv) directly heating the die and the first substrate 30, or subjecting them to vibration using an ultrasonic wave or the like. In other words, the tuner section 10 and the demodulating section 20 may be mounted as follows. Namely, a conductive jointing member is formed beforehand on the external connection electrode on the surface of each die which has been cut out from a wafer, and which is the tuner section 10 or the demodulating section 20 formed in the form of semiconductor integrated circuit having a suitable thickness. The position of the electrode on the mount portion surface (mount surface) of the first substrate 30 and the position of the external connection electrode on the die are accurately positioned. Then, the die and the first substrate 30 are connected by heating, vibrating or using other fixing means.

Further, the tuner section 10 or the demodulating section 20 may be mounted as follows. Namely, a wiring layer which is a combination of an insulation member and wiring is newly formed on the surface of the die which is the tuner section 10 or the demodulating section 20 formed in the form of the semiconductor integrated circuit, so as to modify the position of the external electrode on the surface of the die (surface of the wiring layer) thereby realizing a suitable electrode arrangement in consideration of productivity and yield. A conductive jointing material is formed on the external connection electrode, and the electrode on the surface of the mount portion of the first substrate 30 and the external connection terminal of the wiring layer are accurately positioned so that the respective positions of them are matched with each other, after which the electrodes are connected to each other by heating, vibrating or by using other fixing means.

Further, it is possible to: (i) fix, by using an adhesive material, the back face of the die which is the tuner section 10 or demodulating section 20 formed as the semiconductor integrated circuit, onto the mount portion of the first substrate 30; and (ii) connect the external connection electrode on the surface of the die with the electrode formed on the surface of the mount portion via a conductive material.

Figure 13:
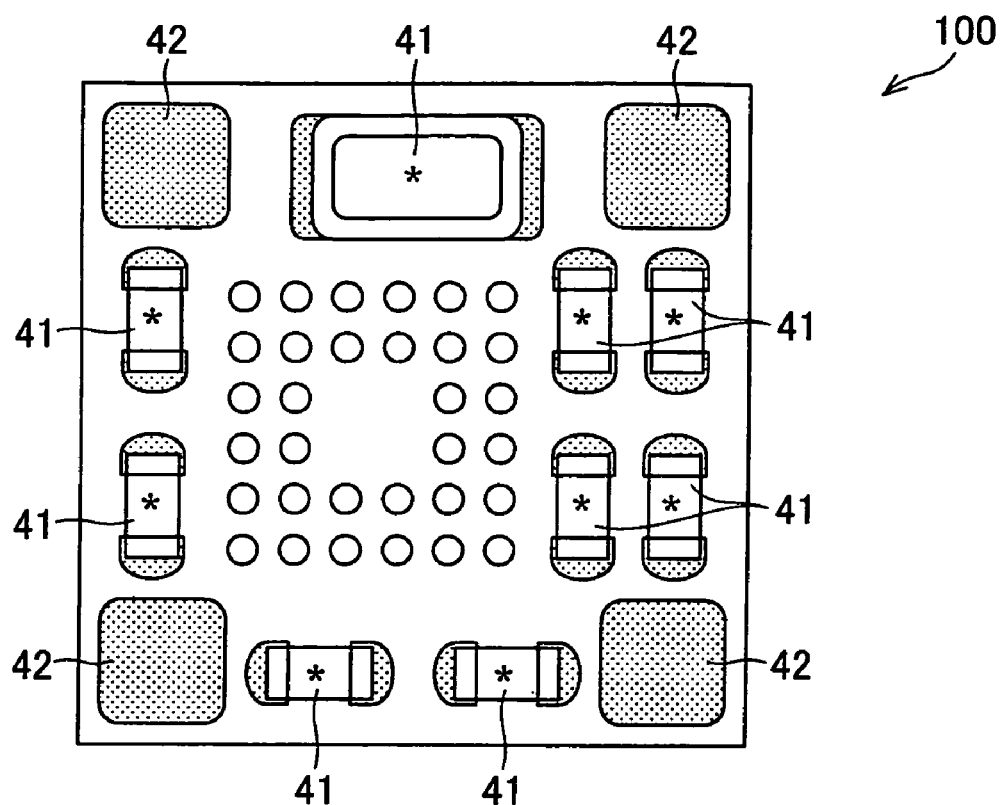
FIG. 13 is a plane view illustrating yet another exemplary mounting method for use in the case of realizing, in the form of semiconductor integrated circuit, the tuner section and the demodulating section to be provided to the receiving device of the embodiment, in accordance with the present invention.
Figure 13:
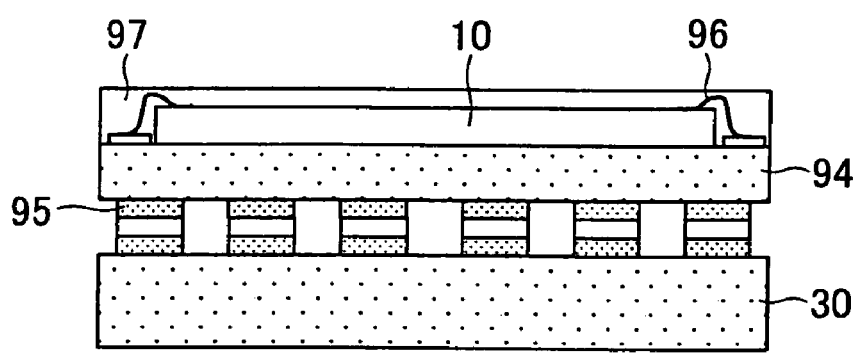

Further, as illustrated in FIG. 13, it is possible to fix the die on a substrate 94 which is not the lead frame, and bond an electrode 95 on the substrate 94 with the external electrode (not shown) of the die via a conductive line 96 made of gold or the like. Then, a package of the die and the substrate 94 are formed by sealing them with resin 97. This package may be mounted on the mount portion of the first substrate 30. In other words, the die may be mounted on a separate wiring board or a conductive frame, with a use of a conductive jointing material or a conductive line material. Then, the package is formed by sealing with a dustproof and vapor-proof sealing material such as resin, and the package may be mounted on the mount surface of the first substrate 30.

Further, the reliability is improved by (i) directly mounting the die which is the tuner section 10 or the demodulating section 20 formed as a semiconductor integrated circuit on the mount surface (on the front or back surface of the mount portion) of the first substrate 30; (ii) bonding the external connection electrode with the electrode on the mount portion via a conductive line made of gold or the like; and then (iii) sealing the entire die or peripheral portion of the die with resin to prevent dust and vapor. In other words, after the die is mounted on the mount surface, a dustproof and vapor-proof sealing material such as resin may be applied to the periphery of the die or the entire die.

Further, after the demodulating section is mounted to the back surface (the surface facing the second substrate 70) of the receiving device 100, if there is a redundant space, the space may be sealed with a sealing material such as resin in such a manner that the sealing material does not deteriorate the connection between the terminal electrode on the back surface and the receiving device mounting substrate. This is more advantageous in terms of preventing vapor and dust.

Note that the present embodiment deals with a case where the demodulating section 20 is arranged on the surface of the first substrate 30 which surface faces the second substrate 70. However the present invention is not limited to this and the tuner section 10 and the demodulating section 20 may be mounted other way around.

In order to solve the foregoing problems, a receiving device of the present invention includes: a multilayered substrate; a tuner section provided on one surface of said multilayered substrate; and a demodulation section provided on another surface of said multilayered substrate, wherein said tuner section extracts a particular high-frequency signal from a plurality of digitally modulated high-frequency signals, and converts the particular high-frequency signal into a low-frequency signal, said demodulation section demodulates the low-frequency signal output from said tuner section by converting it into a digital signal, and said multilayered substrate includes (i) an analog GND layer connected to said tuner section, (ii) a digital GND layer connected to said demodulation section, and (iii) a shield GND layer which is provided between said analog GND layer and digital GND layer, and which is isolated from the both GND layers by insulation layers.

In the above configuration, the shield GND layer is provided between the digital GND layer and the analog GND layer. Thus, the current of harmonic signals is prevented from flowing into the analog GND. Accordingly, it is possible to downsize the receiving device by arranging the tuner section on one surface of the multilayered substrate and the demodulating section on another surface of the substrate, and yet prevent deterioration in the receiving capability by preventing the tuner section from being influenced by the harmonic signals from the demodulating section.

Further, the receiving device of the present invention may be so adapted that: said multilayered substrate is formed by laminating a plurality of insulation layers and a plurality of wiring layers; and amongst the plurality of insulation layers, at least one of said insulation layers isolating said shield GND layer from said analog GND layer and said digital GND layer is thicker than the other insulation layers.

The value of the parasitic capacitance between the analog GND layer and the shield GND layer, and the value of the parasitic capacitance between the digital GND layer and the shield GND layer are reduced in inverse proportion to a square-distance between the GNDs. Accordingly, by providing the thickening the insulation layer between the analog GND layer and shield GND layer, and/or the insulation layer between the digital GND layer and shield GND layer, the impedance of the parasitic capacitance between the GNDs is increased. This suitably prevents a current of a harmonic signal from the digital GND from flowing into the analog GND.

Further, the receiving device of the present invention may be so adapted that: said multilayered substrate is formed by laminating (i) a plurality of insulation layers each having the same thickness and (ii) a plurality of wiring layers; and more than one insulation layer amongst the plurality of insulation layers is provided (a) between said shield GND layer and analog GND layer, and/or (b) between said shield GND layer and digital GND layer. In this case, for example, one of the insulation layer may be an insulation layer whose surface has no wiring layer, and which only has a via for connecting upper and lower wiring layers.

With the configuration, the impedance of the parasitic capacitance between the shield GND layer and another GND layer is increased. This suitably prevents a current of a harmonic signal from the digital GND from flowing into the analog GND. Further, in this case, it is not necessary to thicken a particular insulation layer, and the impedance of the parasitic capacitance between GND layers is increased with the use of insulation layers having the same thickness. Therefore, a manufacturing process is simpler as compared with the case of thickening a particular insulation layer.

Further, the receiving device of the present invention may be so adapted that: an opposing surface of said shield GND layer, which surface faces said analog GND layer or said digital GND layer, has a smaller planer dimension than a surface, of said analog GND layer or said digital GND layer, which faces said opposing surface of said shield GND layer.

With the configuration, the impedance of the parasitic capacitance between the shield GND layer and another GND layer facing the shield GND layer is increased. This suitably prevents a current of a harmonic signal from the digital GND from flowing into the analog GND.

Further, the receiving device of the present invention may further include: a shield GND connection terminal for connecting said GND layer to an external GND which is outside said receiving device, wherein at least one of (i) a parasitic capacitance formed between said shield GND layer and analog GND layer and (ii) a parasitic capacitance formed between said shield GND layer and digital GND layer has a larger impedance, for a frequency of said particular high-frequency signal, compared to that between said shield GND layer and shield GND connection terminal.

With the configuration, a current of a harmonic signal from the digital GND is prevented from flowing into the analog GND.

Further, the receiving device of the present invention may be so adapted that: said tuner section and/or demodulation section is/are made in the form of semiconductor integrated circuit.

The present invention is applicable to a receiving device and a substrate having the same, which apparatus having (i) a tuner section for extracting a particular high-frequency signal from plural digitally modulated high-frequency signals, and converting the extracted high-frequency signal into a low-frequency signal; and (ii) a demodulating section for performing demodulation process by converting the low-frequency signal output from the tuner section into a digital signal.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A receiving device comprising:
a multilayered substrate;
a tuner section provided on one surface of said multilayered substrate; and
a demodulation section provided on another surface of said multilayered substrate, wherein
said tuner section extracts a particular high-frequency signal from a plurality of digitally modulated high-frequency signals, and converts the particular high-frequency signal into a low-frequency signal,
said demodulation section demodulates the low-frequency signal output from said tuner section by converting it into a digital signal, and
said multilayered substrate includes (i) an analog GND layer connected to said tuner section, (ii) a digital GND layer connected to said demodulation section, and (iii) a shield GND layer which is provided between said analog GND layer and digital GND layer, and which is isolated from the analog and digital GND layers by insulation layers.

2. The receiving device as set forth in claim 1, wherein:
said multilayered substrate is formed by laminating a plurality of insulation layers and a plurality of wiring layers; and
amongst the plurality of insulation layers, at least one of said insulation layers isolating said shield GND layer from said analog GND layer and said digital GND layer is thicker than the other insulation layers.

3. The receiving device as set forth in claim 1, wherein:
said multilayered substrate is formed by laminating (i) a plurality of insulation layers each having the same thickness and (ii) a plurality of wiring layers; and
more than one insulation layer amongst the plurality of insulation layers is provided (a) between said shield GND layer and analog GND layer, and/or (b) between said shield GND layer and digital GND layer.

4. The receiving device as set forth in claim 1, wherein:
an opposing surface of said shield GND layer, which surface faces said analog GND layer or said digital GND layer, has a smaller planer dimension than a surface, of said analog GND layer or said digital GND layer, which faces said opposing surface of said shield GND layer.

5. The receiving device as set forth in claim 1, further comprising:
a shield GND connection terminal for connecting said GND layer to an external GND which is outside said receiving device, wherein
at least one of (i) a parasitic capacitance formed between said shield GND layer and analog GND layer and (ii) a parasitic capacitance formed between said shield GND layer and digital GND layer has a larger impedance, for a frequency of said particular high-frequency signal, compared to that between said shield GND layer and shield GND connection terminal.

6. The receiving device as set forth in claim 1, wherein said tuner section and/or demodulation section is/are made in the form of semiconductor integrated circuit.

* * * * *